(12) United States Patent
Mishra et al.

(10) Patent No.: US 7,541,123 B2
(45) Date of Patent: Jun. 2, 2009

(54) IMAGING MEMBER

(75) Inventors: Satchidanand Mishra, Webster, NY (US); Robert C. U. Yu, Webster, NY (US); Kathleen M. Carmichael, Williamson, NY (US)

(73) Assignee: Xerox Corporation, Norwalk, CT (US)

( * ) Notice: Subject to any disclaimer, the term of this patent is extended or adjusted under 35 U.S.C. 154(b) by 364 days.

(21) Appl. No.: 11/156,882

(22) Filed: Jun. 20, 2005

(65) Prior Publication Data
US 2006/0284194 A1 Dec. 21, 2006

(51) Int. Cl.
G03H 15/02 (2006.01)
G03H 15/04 (2006.01)

(52) U.S. Cl. ............... 430/64; 430/58; 430/59; 430/62; 430/65; 430/66

(58) Field of Classification Search .......... 430/58, 430/59, 64, 65, 58.05, 59.1, 62
See application file for complete search history.

(56) References Cited

U.S. PATENT DOCUMENTS

| | | | |
|---|---|---|---|
| 3,121,006 A | 2/1964 | Middleton et al. |
| 3,820,989 A | 6/1974 | Rule et al. |
| 3,837,851 A | 9/1974 | Shattuck et al. |
| 4,150,987 A | 4/1979 | Anderson et al. |
| 4,245,021 A | 1/1981 | Kazami et al. |
| 4,256,821 A | 3/1981 | Enomoto et al. |
| 4,278,746 A | 7/1981 | Goto et al. |
| 4,286,033 A | 8/1981 | Neyhart et al. |
| 4,291,110 A | 9/1981 | Lee |
| 4,297,426 A | 10/1981 | Sakai et al. |
| 4,315,982 A | 2/1982 | Ishikawa et al. |
| 4,338,387 A | 7/1982 | Hewitt |
| 4,338,388 A | 7/1982 | Sakai et al. |
| 4,385,106 A | 5/1983 | Sakai |
| 4,387,147 A | 6/1983 | Sakai |
| 4,399,207 A | 8/1983 | Sakai et al. |
| 4,399,208 A | 8/1983 | Takasu et al. |
| 4,587,189 A | 5/1986 | Hor et al. |
| 4,664,995 A | 5/1987 | Horgan et al. |
| 4,988,597 A | 1/1991 | Spiewak et al. |
| 5,096,795 A | 3/1992 | Yu |
| 5,215,839 A | 6/1993 | Yu |
| 5,244,762 A | 9/1993 | Spiewak et al. |
| 5,378,566 A * | 1/1995 | Yu .................... 430/58.05 |
| 5,571,649 A | 11/1996 | Mishra et al. |
| 5,576,130 A | 11/1996 | Yu et al. |
| 5,591,554 A | 1/1997 | Mishra et al. |
| 5,643,702 A | 7/1997 | Yu |

(Continued)

OTHER PUBLICATIONS

U.S. Appl. No. 10/816,829, filed Apr. 5, 2004, Qi et al.

(Continued)

*Primary Examiner*—Kenneth Parker
*Assistant Examiner*—Joseph Nguyen
(74) *Attorney, Agent, or Firm*—Eugene O. Palazzo; Fay Sharpe LLP

(57) ABSTRACT

An imaging member includes an electrically conductive layer; a positive charge blocking layer, an imaging layer, and an undercoat layer. The undercoat layer is intermediate the imaging layer and the electrically conductive layer. The undercoat layer includes a film forming polymer and a particulate material dispersed therein. The particulate material supports a charge blocking material thereon.

22 Claims, 3 Drawing Sheets

U.S. PATENT DOCUMENTS

| | | |
|---|---|---|
| 5,697,024 A | 12/1997 | Mishra |
| 5,703,487 A | 12/1997 | Mishra |
| 5,756,245 A | 5/1998 | Esteghamatian et al. |
| 6,008,653 A | 12/1999 | Popovic et al. |
| 6,071,661 A * | 6/2000 | Hsieh et al. .................... 430/67 |
| 6,117,603 A | 9/2000 | Yu et al. |
| 6,119,536 A | 9/2000 | Popovic et al. |
| 6,124,514 A | 9/2000 | Emmrich et al. |
| 6,150,824 A | 11/2000 | Mishra et al. |
| 6,214,514 B1 | 4/2001 | Evans et al. |
| 6,255,027 B1 | 7/2001 | Wehelie et al. |
| 6,294,300 B1 | 9/2001 | Carmichael et al. |
| 6,326,111 B1 | 12/2001 | Chambers et al. |
| 2004/0142258 A1 * | 7/2004 | Fukushima et al. ........... 430/56 |

OTHER PUBLICATIONS

U.S. Appl. No. 10/824,218, filed Apr. 14, 2004, Qi et al.
U.S. Appl. No. 10/892,384, filed Jul. 16, 2004, Qi et al.
U.S. Appl. No. 10/982,719, filed Nov. 5, 2004, Yu et al.
U.S. Appl. No. 11/081,650, filed Mar. 17, 2005, Nukada et al.
U.S. Appl. No. 11/083,027, filed Mar. 18, 2005, Shiino et al.
U.S. Appl. No. 11/181,966, filed Jul. 14, 2005, Lin et al.
U.S. Appl. No. 11/223,014, filed Sep. 12, 2005, Mishra et al.
U.S. Appl. No. 11/314,484, filed Dec. 21, 2005, Mishra et al.
U.S. Appl. No. 11/425,179, filed Jun. 20, 2006, Yu et al.
U.S. Appl. No. 11/611,555, filed Dec. 15, 2006, Mishra et al.
U.S. Appl. No. 10/320,808, filed Dec. 16, 2002, Horgan et al.
U.S. Appl. No. 10/655,882, filed Sep. 5, 2003, Pai et al.
U.S. Appl. No. 10/736,864, filed Dec. 16, 2003, Horgan et al.

* cited by examiner

IMAGING MEMBER

BACKGROUND

There is disclosed herein an imaging member used in electrophotography. More particularly disclosed herein is a negatively charged imaging member that has an undercoat layer which spaces a photogenerating layer from an electrically conductive layer of the imaging member to effectively block positive charge movement therebetween.

A typical negatively-charged electrophotographic imaging member is imaged by uniformly depositing an electrostatic charge on an imaging surface of the electrophotographic imaging member and then exposing the imaging member to a pattern of activating electromagnetic radiation, such as light, which selectively dissipates the charge in the illuminated areas of the imaging member while leaving behind an electrostatic latent image in the non-illuminated areas. This electrostatic latent image may then be developed to form a visible image by depositing finely divided electroscopic marking toner particles on the imaging member surface. The resulting visible toner image can then be transferred to a suitable receiving member, such as paper.

A number of current electrophotographic imaging members are multilayered photoreceptors that, in a negative charging system, comprise a substrate support, an electrically conductive layer, an optional charge blocking layer, an optional adhesive layer, a charge generating layer, a charge transport layer, and optional protective or overcoating layer(s). The multilayered photoreceptors can take several forms, for example, flexible belts, rigid drums, flexible scrolls, and the like. Flexible photoreceptor belts may either be seamed or seamless belts. An anti-curl layer may be employed on the back side of the flexible substrate support, the side opposite to the electrically active layers, to achieve a desired photoreceptor belt flatness.

Although excellent toner images may be obtained with multilayered belt photoreceptors, a delicate balance in charging image and bias potentials, and characteristics of toner/developer is generally maintained. This places additional constraints on photoreceptor manufacturing, and thus, on the manufacturing yield. Localized microdefect sites, varying in size of from about 50 to about 200 microns, can sometimes occur in manufacture, which appear as print defects (microdefects) in the final imaged copy. In charged area development, where the charged areas are printed as dark areas, the sites print out as white spots. These microdefects are called microwhite spots. In discharged area development systems, where the exposed area (discharged area) is printed as dark areas, these sites print out as dark spots on a white background. All of these microdefects, which exhibit inordinately large dark decay, are called charge deficient spots (CDS). Since the microdefect sites are fixed in the photoreceptor, the spots are registered from one cycle of belt revolution to next.

Whether these localized microdefect or charge deficient spot sites will show up as print defects in the final document depends, to some degree, on the development system utilized and, thus, on the machine design selected. For example, some of the variables governing the final print quality include the surface potential of photoreceptor, the image potential of the photoreceptor, photoreceptor to development roller spacing, toner characteristics (such as size, charge, and the like), the bias applied to the development rollers and the like. The image potential depends on the light level selected for exposure. The defect sites are discharged, however, by the dark discharge rather than by the light. The copy quality from generation to generation is maintained in a machine by continuously adjusting some of the parameters with cycling. Thus, defect levels may also change with cycling.

Techniques have been developed for the detection of CDS's. These have largely involved destructive testing, although some contactless methods have been developed. Generally, photoreceptor belt specifications set a maximum on the number of charge deficient spots which are acceptable. Testing of a belt includes installation on a well-controlled electrophotographic machine and forming prints. The prints are scanned on a fixed scanner. If a belt does not meet the specifications, it is rejected.

Multilayer imaging members have been developed to block positive charge (hole) injection from the electrically conductive layer which can give rise to CDS's. For example, a polysilane blocking layer is used to separate the electrically conductive layer of the imaging member from the charge generation layer.

INCORPORATION BY REFERENCE

The following patents, the disclosures of which are incorporated in their entireties by reference, are mentioned:

U.S. Pat. No. 5,215,839 to Robert Yu discloses a layered electrophotographic imaging member. The member is modified to reduce the effect of interference caused by the reflections from coherent light incident on a ground plane. Modification involves an interface layer between a blocking layer and a charge generation layer, the interface layer comprising a polymer having incorporated therein filler particles of a synthetic silica or mineral particles. The filler particles scatter the light to prevent reflections from the ground plane back to the light incident the surface.

U.S. Pat. No. 6,255,027 to Wehelie, et al. discloses a photoreceptor including a substrate, a charge blocking layer, and an imaging layer. The charge blocking layer includes light scattering particles dispersed in a binder. The light scattering particles are composed of a core and a coating over the core. The difference between the coating and the binder refractive index values is greater than the difference between the core and the binder refractive index values.

U.S. Pat. No. 5,096,795 to Yu describes an electrophotographic imaging member comprising a charge transport layer including a thermoplastic film forming binder, aromatic amine charge transport molecules, and a homogeneous dispersion of at least one of organic and inorganic particles having a particle diameter less than about 4.5 micrometers, the particles comprising a material selected from the group consisting of microcrystalline silica, ground glass, synthetic glass spheres, diamond, corundum, topaz, polytetrafluoroethylene, and waxy polyethylene. The particles provide coefficient of surface contact friction reduction, increased wear resistance, durability against tensile cracking, and improved adhesion of the layers without adversely affecting the optical and electrical properties of the imaging member.

U.S. Pat. No. 6,326,111 to Chambers, et al. discloses a stable charge transport layer comprising a dispersion containing polytetrafluoroethylene particles and hydrophobic silica in a polycarbonate polymer binder and at least one charge transport material.

U.S. Pat. No. 6,117,603 to Yu, et al. discloses an outermost exposed layer of a photoreceptor containing organic or inorganic particles dispersed therein. The particles may be treated with a hydrolyzed silane solution.

U.S. Pat. No. 6,294,300 to Carmichael, et al. discloses a photoconductor which includes a charge transport layer coated over a charge generator layer. A hole transport molecule is intentionally added to the charge generator layer preventing migration of hole transport molecules from the charge transport layer to the charge generator layer.

U.S. Pat. No. 5,378,566 to Yu, et al. discloses an electrophotographic imaging member including a substrate, a hole blocking adhesive layer, a charge generating layer and a charge transport layer. The hole blocking adhesive layer includes a polyester film forming binder having dispersed therein a particulate reaction product of metal oxide particles and a hydrolyzed reactant selected from nitrogen containing organosilanes, organotitanates and organozirconates.

U.S. Pat. No. 5,643,702 to Yu discloses an electrophotographic imaging member comprising a substrate layer, an adhesive layer comprising a thermoplastic polyurethane film forming resin, a thin vapor deposited charge generating layer consisting essentially of a thin homogeneous vacuum sublimation deposited film of an organic photogenerating pigment, and a charge transport layer.

U.S. Pat. Nos. 5,703,487; 6,008,653; 6,119,536; and 6,150,824 disclose methods for detecting CDS's. In the '487 patent, a process for ascertaining the microdefect levels of an electrophotographic imaging member includes measuring either the differential increase in charge over and above the capacitive value or measuring reduction in voltage below the capacitive value of a known imaging member and of a virgin imaging member and comparing differential increase in charge over and above the capacitive value or the reduction in voltage below the capacitive value of the known imaging member and of the virgin imaging member.

U.S. Pat. No. 6,008,653 to Popovic, et al. discloses a method for detecting surface potential charge patterns in an electrophotographic imaging member with a floating probe scanner. The scanner includes a capacitive probe, which is optically coupled to a probe amplifier, and an outer Faraday shield electrode connected to a bias voltage amplifier. The probe is maintained adjacent to and spaced from the imaging surface to form a parallel plate capacitor with a gas between the probe and the imaging surface. A constant voltage charge is applied to the imaging surface prior to establishing relative movement of the probe and the imaging surface. Variations in surface potential are measured with the probe and compensated for variations in distance between the probe and the imaging surface. The compensated voltage values are compared to a baseline voltage value to detect charge patterns in the electrophotographic imaging member.

U.S. Pat. No. 6,150,824 to Mishra, et al. discloses a contactless system for detecting electrical patterns on the outer surface of an imaging member which includes repetitively measuring the charge pattern on the outer surface with an electrostatic voltmeter probe maintained at a substantially constant distance from the surface, the distance between the probe and the imaging member being slightly greater than the minimum distance at which Paschen breakdown will occur to form a parallel plate capacitor with a gas between the probe and the surface.

U.S. Pat. No. 5,703,487 to Mishra discloses a process for ascertaining the microdefect levels of an electrophotographic imaging member comprising the steps of measuring either the differential increase in charge over and above the capacitive value or measuring reduction in voltage below the capacitive value of a known imaging member and of a virgin imaging member and comparing differential increase in charge over and above the capacitive value or the reduction in voltage below the capacitive value of the known imaging member and of the virgin imaging member.

U.S. Pat. Nos. 5,591,554; 5,576,130; and 5,571,649 disclose methods for preventing charge injection from substrates which give rise to CDS's. These patents disclose an electrophotographic imaging member including a support substrate having a two layered electrically conductive ground plane layer comprising a layer comprising zirconium over a layer comprising titanium, a hole blocking layer, and an adhesive layer. The adhesive layer of the '554 patent includes a copolyester film forming resin, and the member further includes an intermediate layer comprising a carbazole polymer, a charge generation layer comprising a perylene or a phthalocyanine, and a hole transport layer, which is substantially non-absorbing in the spectral region at which the charge generation layer generates and injects photogenerated holes. The adhesive layer of the '130 patent comprises a thermoplastic polyurethane film forming resin. The adhesive layer of the '649 patent comprises a polymer blend comprising a carbazole polymer and a film forming thermoplastic resin in contiguous contact with a hole blocking layer.

BRIEF DESCRIPTION

Aspects of the exemplary embodiment relate to an imaging member and a method of forming an imaging member. In one aspect, the imaging member includes an electrically conductive layer; a positive charge blocking layer, an imaging layer, and an undercoat layer. The undercoat layer is intermediate the imaging layer and the electrically conductive layer. The undercoat layer includes a film forming polymer and a particulate material dispersed therein. The particulate material supports a charge blocking material thereon.

In another aspect, the imaging member includes an optional substrate, a charge blocking layer, a charge generation layer, a charge transport layer, an optional adhesive interface layer intermediate the charge blocking layer and the charge generation layer, and an undercoat layer intermediate the charge blocking layer and the charge generation layer. The undercoat layer includes a film forming polymer and a particulate material supporting a charge blocking material thereon dispersed therein. The film forming polymer is insoluble in a solvent used in forming the charge generation layer.

In another aspect, the method includes forming a blocking layer over an electrically conductive layer and forming an undercoat layer over the blocking layer, the undercoat layer comprising a film forming polymer and a particulate material dispersed therein. The particulate material supports a charge blocking material thereon. An imaging layer is formed over the undercoat layer. The imaging layer includes a charge transport component in a film forming binder.

DETAILED DESCRIPTION

Figure 1:
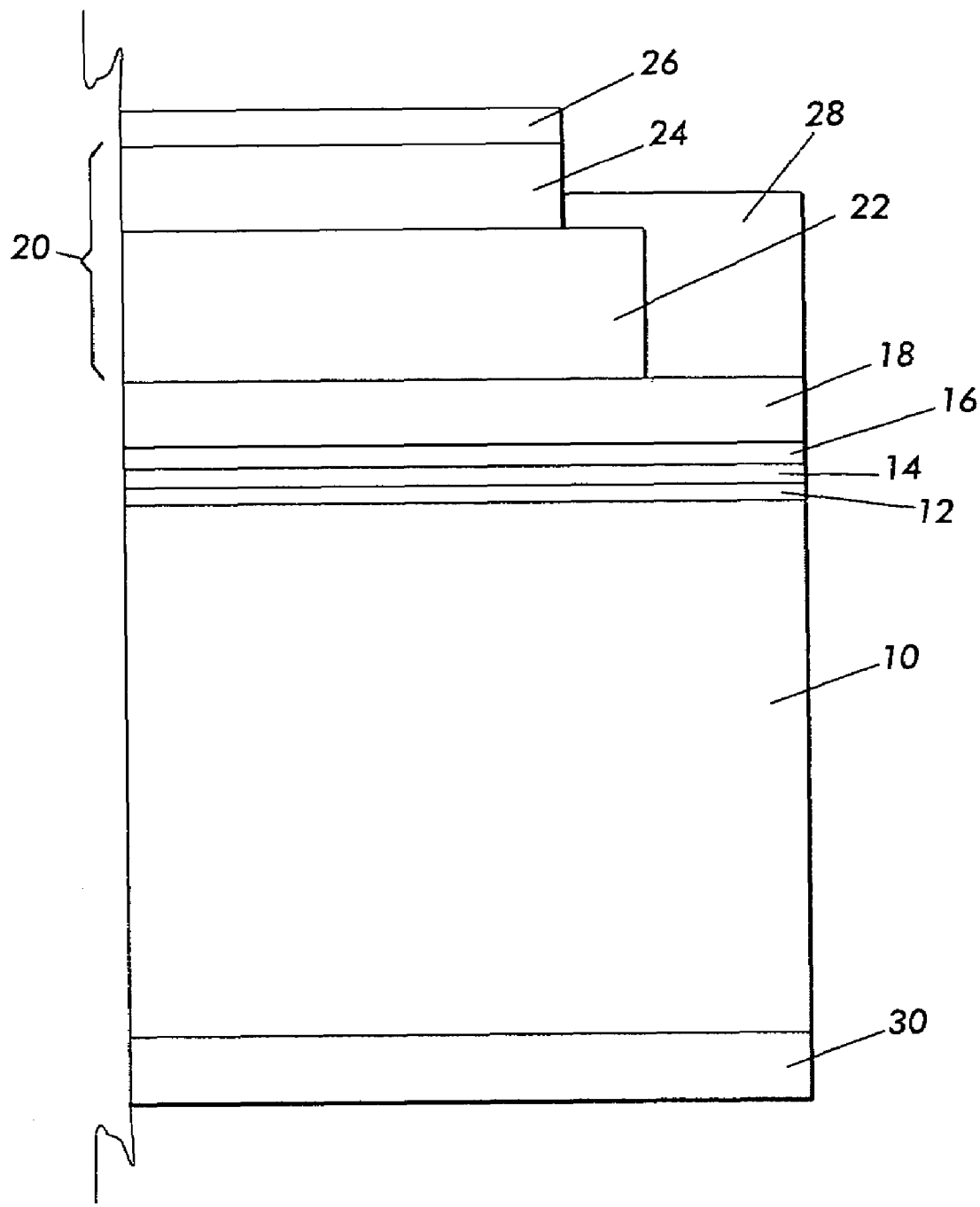
FIG. 1 is a schematic cross sectional view of an exemplary imaging member according to a first embodiment.

Aspects of the exemplary embodiments disclosed herein relate to an imaging member, to a method of formation of an imaging member, and to a method of use of such an imaging member. Although the embodiments disclosed herein are applicable to electrophotographic imaging members in flexible belt configuration and rigid drum form, for reason of simplicity, the discussions below are focused upon electrophotographic imaging members in flexible belt designs.

In aspects of the exemplary embodiment disclosed herein, there is provided a negatively charged imaging member comprising a charge (or hole) blocking layer with a photogenerating (charge generating) layer and an imaging layer comprising a charge transport layer disposed thereon. An undercoat layer spaces the charge generating layer from the charge (or hole) blocking layer.

In aspects disclosed herein, the undercoat layer comprises a material which inhibits diffusion or migration of the charge transport component from the charge transport layer to the blocking layer, for example, during deposition of a coating solution for forming the charge transport layer.

In a further embodiment, the undercoat layer comprises a film forming polymer in which the solvent used to form the charge transport layer solution is insoluble.

In another aspect, the undercoat layer comprises a particulate support material dispersed in the film forming polymer. The surface of the particulate material supports a positive charge blocking material in the form of a coating. The positive charge blocking material may comprise a silane, such as an N-functional silane. One such N-functional silane is a 3-aminopropyl triethoxy silane, which is capable of blocking positive charge injection from projections of the conducting ground plane layer.

The charge transport layer may comprise a film forming polymeric binder and a charge transport component, such as hole transport molecules, molecularly dispersed or dissolved therein to form a solid solution.

Without being bound by any particular theory, it is proposed that one source of localized dark decay in images formed on negatively charged photoreceptors is the injection of positive charge (holes) from a photoreceptor substrate. Charge transport molecules, such as N,N'-diphenyl-N,N'-bis[3-methylphenyl]-[1,1'-biphenyl]-4,4'-diamine, may enhance localized dark decay by increasing the injection of charge from the electrically conductive ground plane layer of a photoreceptor substrate. In general, it is understood that the proximity of the charge transport molecules to the substrate influences the charge injection since the charge transport molecules are hole conducting species. Where the charge generation layer and/or adhesive layer of the photoreceptor are soluble toward the charge transport molecules, these relatively small molecules may diffuse through the charge generation layer and/or adhesive layer during the application of a coating solution for forming the charge transport layer. The diffusing molecules may reach the ground plane layer and facilitate positive charge injection during an electrophotographic imaging process.

It is proposed that positive charge injection from the ground plane layer may also occur through defects in the blocking layer. The blocking layer is usually a relatively thin layer, of only a few nanometers in thickness. Therefore, if the ground plane layer itself includes spiked projections which exceed the thickness of the blocking layer, the tips of these projections may not be fully covered by the blocking layer and be exposed. Moreover, in photoreceptors which are formed over a flexible MYLAR™ substrate web stock, the MYLAR may remain as high projection spots even after deposition of a nano-thickness thin metal ground plane layer thereon. In drum photoreceptors, particularly those finished by lathing or which are mechanically extruded, similar forms of charge injection may occur.

The exemplary undercoat layer may resist formation of charge deficient spots in various ways. First, by forming the undercoat layer from a film forming polymer in which the solvent used to form the charge transport layer solution is insoluble, the diffusion of the hole conducting charge transport molecules toward the underlying substrate is reduced or suppressed. Second, by incorporating a positive charge blocking material (e.g., as encapsulated particles) in a finely dispersed form (and thus with a large surface area) throughout the polymer matrix of the undercoat layer, injection of charge from the ground plane layer may be reduced. Both of these beneficial effects can be provided by the disclosed undercoat layer and may contribute to a reduction in CDSs.

CDS can thus be reduced, including those spots which appear as microblack spots on white backgrounds but which appear as microwhite spots on dark backgrounds, by reducing the migration of the charge transport molecules as well as through blocking coverage of the ground plane spiked projections.

Processes of imaging, especially xerographic imaging and printing, including digital printing, are also encompassed by the present disclosure. More specifically, the layered photoconductive imaging member of the present embodiment can be selected for a number of different known imaging and printing processes including, for example, electrophotographic imaging processes, especially xerographic imaging and printing processes wherein charged latent images are rendered visible with toner compositions of an appropriate charge polarity. Moreover, the imaging members disclosed are useful in color xerographic applications, particularly high-speed color copying and printing processes and which members are in embodiments sensitive in the wavelength region of, for example, from about 500 to about 900 nanometers, and in particular from about 650 to about 850 nanometers, thus diode lasers can be selected as the light source.

An exemplary embodiment of the multilayered electrophotographic imaging member of flexible belt configuration is illustrated in FIG. 1. The exemplary imaging member includes a support substrate 10 having an optional conductive surface layer or layers 12 (which may be referred to herein as a ground plane layer), a hole blocking layer 14, an optional adhesive interface layer 16, an undercoat layer 18, an imaging layer 20 comprising a charge generating layer 22 and a charge transport layer 24, and optionally one or more overcoat and/or protective layer 26. While the imaging layer 20 will be described with reference to two separate layers, it will be appreciated that the functional components of these layers may alternatively be combined into a single layer, as discussed below.

The lower surface of illustrated charge transport layer 24 is in direct contact with the upper surface of the charge generating layer 22 and an upper surface of layer 24 may be the outermost exposed surface of the imaging member if no overcoat layer 26 is employed or, where an overcoat layer 26 or layer is used, the upper surface of layer 24 is in direct contact with the overcoat layer. Other layers of the imaging member may include, for example, an optional ground strip layer 28, applied to one edge of the imaging member to promote electrical continuity with the conductive layer 12 through the hole blocking layer 14. An anticurl back coating layer 30 may be formed on the backside of the support substrate 10. The conductive ground plane 12 is typically a thin metallic layer, for example a 10 nanometer thick titanium coating, deposited over the substrate 10 by vacuum deposition or sputtering process. The layers 14, 16, 18, 22, 24, and 26 may be separately and sequentially deposited on to the surface of conductive ground plane 12 of substrate 10 as solutions comprising a solvent, with each layer being dried before deposition of the next.

The Substrate

The photoreceptor support substrate 10 may be opaque or substantially transparent, and may comprise any suitable organic or inorganic material having the requisite mechanical properties. The entire substrate can comprise the same material as that in the electrically conductive surface, or the electrically conductive surface can be merely a coating on the substrate. Any suitable electrically conductive material can be employed. Typical electrically conductive materials include copper, brass, nickel, zinc, chromium, stainless steel, conductive plastics and rubbers, aluminum, semitransparent aluminum, steel, cadmium, silver, gold, zirconium, niobium, tantalum, vanadium, hafnium, titanium, nickel, chromium, tungsten, molybdenum, paper rendered conductive by the inclusion of a suitable material therein or through conditioning in a humid atmosphere to ensure the presence of sufficient water content to render the material conductive, indium, tin, metal oxides, including tin oxide and indium tin oxide, and the like.

The substrate 10 can also be formulated entirely of an electrically conductive material, or it can be an insulating material including inorganic or organic polymeric materials, such as, MYLAR™, a commercially available biaxially oriented polyethylene terephthalate from DuPont, MYLAR™ with a ground plane layer 12 comprising a conductive titanium or titanium/zirconium coating, otherwise a layer of an organic or inorganic material having a semiconductive surface layer, such as indium tin oxide, aluminum, titanium, and the like, or exclusively be made up of a conductive material such as, aluminum, chromium, nickel, brass, other metals and the like. The thickness of the support substrate depends on numerous factors, including mechanical performance and economic considerations.

The substrate 10 may be flexible, being seamed or seamless for flexible photoreceptor belt fabrication or it can be rigid for use as an imaging member for plate design applications. The substrate may have a number of many different configurations, such as, for example, a plate, a drum, a scroll, an endless flexible belt, and the like. In one embodiment, the substrate is in the form of a seamed flexible belt.

The thickness of the substrate 10 depends on numerous factors, including flexibility, mechanical performance, and economic considerations. The thickness of the support substrate 10 may range from about 50 micrometers to about 3,000 micrometers. In embodiments of flexible photoreceptor belt preparation, the thickness of substrate 10 is from about 50 micrometers to about 200 micrometers for optimum flexibility and to effect minimum induced photoreceptor surface bending stress when a photoreceptor belt is cycled around small diameter rollers in a machine belt support module, for example, 19 millimeter diameter rollers. The surface of the support substrate is cleaned prior to coating to promote greater adhesion of the deposited coating composition.

An exemplary substrate support 10 is not soluble in any of the solvents used in each coating layer solution, is optically transparent, and is thermally stable up to a high temperature of about 150° C. A typical substrate support 10 used for imaging member fabrication has a thermal contraction coefficient ranging from about $1 \times 10^{-5}/°$ C. to about $3 \times 10^{-5}/°$ C. and a Young's Modulus of between about $5 \times 10^5$ psi ($3.5 \times 10^4$ Kg/cm$^2$) and about $7 \times 10^5$ psi ($4.9 \times 10^4$ Kg/cm$^2$).

The Conductive Layer

The conductive ground plane layer 12 may vary in thickness depending on the optical transparency and flexibility desired for the electrophotographic imaging member. When a photoreceptor flexible belt is desired, the thickness of the conductive layer 12 on the support substrate 10, for example, a titanium and/or zirconium conductive layer produced by a sputtered deposition process, typically ranges from about 2 nanometers to about 75 nanometers to enable adequate light transmission for proper back erase, and in embodiments from about 10 nanometers to about 20 nanometers for an optimum combination of electrical conductivity, flexibility, and light transmission. The conductive layer 12 may be an electrically conductive metal layer which may be formed, for example, on the substrate by any suitable coating technique, such as a vacuum depositing or sputtering technique. Typical metals suitable for use as conductive layer 12 include aluminum, zirconium, niobium, tantalum, vanadium, hafnium, titanium, nickel, stainless steel, chromium, tungsten, molybdenum, combinations thereof, and the like. Where the entire substrate is an electrically conductive metal, the outer surface thereof can perform the function of an electrically conductive layer and a separate electrical conductive layer may be omitted.

The illustrated embodiment will be described in terms of a substrate layer 10 comprising an insulating material including inorganic or organic polymeric materials, such as, MYLAR with a ground plane layer 12 comprising an electrically conductive material, such as titanium or titanium/zirconium, coating over the substrate layer 10.

The Hole Blocking Layer

A hole blocking layer 14 may then be applied to the substrate 10 or to the layer 12, where present. Any suitable positive charge (hole) blocking layer capable of forming an effective barrier to the injection of holes from the adjacent conductive layer 12 into the photoconductive or photogenerating layer may be utilized. The charge (hole) blocking layer may include polymers, such as, polyvinylbutyral, epoxy resins, polyesters, polysiloxanes, polyamides, polyurethanes, HEMA, hydroxylpropyl cellulose, polyphosphazine, and the like, or may comprise nitrogen containing siloxanes or silanes, or nitrogen containing titanium or zirconium compounds, such as, titanate and zirconate. The hole blocking layer may have a thickness in wide range of from about 5 nanometers to about 10 micrometers depending on the type of material chosen for use in a photoreceptor design. Typical hole blocking layer materials include, for example, trimethoxysilyl propylene diamine, hydrolyzed trimethoxysilyl propyl ethylene diamine, N-beta-(aminoethyl) gamma-aminopropyl trimethoxy silane, isopropyl 4-aminobenzene sulfonyl di(dodecylbenzene sulfonyl) titanate, isopropyl di(4-aminobenzoyl)isostearoyl titanate, isopropyl tri(N-ethylaminoethylamino)titanate, isopropyl trianthranil titanate, isopropyl tri(N,N-dimethylethylamino)titanate, titanium-4-amino benzene sulfonate oxyacetate, titanium 4-aminobenzoate isostearate oxyacetate, (gamma-aminobutyl) methyl diethoxysilane which has the formula $[H_2N(CH_2)_4]CH_3Si(OCH_3)_2$, and (gamma-aminopropyl) methyl diethoxysilane, which has the formula $[H_2N(CH_2)_3]CH_3Si(OCH_3)_2$, and combinations thereof, as disclosed, for example, in U.S. Pat. Nos. 4,338,387; 4,286,033; and 4,291,110, incorporated herein by reference in their entireties. Other suitable charge blocking layer polymer compositions are also described in U.S. Pat. No. 5,244,762 which is incorporated herein by reference in its entirety. These include vinyl hydroxyl ester and vinyl hydroxy amide polymers wherein the hydroxyl groups have been partially modified to benzoate and acetate esters which modified polymers are then blended with other unmodified vinyl hydroxy ester and amide unmodified polymers. An example of such a blend is a 30 mole percent benzoate ester of poly(2-hydroxyethyl methacrylate) blended with the parent polymer poly(2-hydroxyethyl methacrylate). Still other suitable charge blocking layer polymer compositions are described in U.S. Pat. No. 4,988,597, which is incorporated herein by reference in its entirety. These include polymers containing an alkyl acrylamidoglycolate alkyl ether repeat unit. An example of such an alkyl acrylamidoglycolate alkyl ether containing polymer is the copolymer poly(methyl acrylamidoglycolate methyl ether-co-2-hydroxyethyl methacrylate). The disclosures of these U.S. Patents are incorporated herein by reference in their entireties.

The blocking layer 14 can be continuous or substantially continuous and may have a thickness of less than about 10 micrometers because greater thicknesses may lead to undesirably high residual voltage. In aspects of the exemplary embodiment, a blocking layer of from about 0.005 micrometers to about 2 micrometers facilitates charge neutralization after the exposure step and optimum electrical performance is achieved. The blocking layer may be applied by any suitable conventional technique, such as, spraying, dip coating, draw bar coating, gravure coating, silk screening, air knife coating, reverse roll coating, vacuum deposition, chemical treatment, and the like. For convenience in obtaining thin layers, the blocking layer may be applied in the form of a dilute solution, with the solvent being removed after deposition of the coating by conventional techniques, such as, by vacuum, heating, and the like. Generally, a weight ratio of blocking layer material and solvent of between about 0.05:100 to about 5:100 is satisfactory for spray coating.

The Adhesive Interface Layer/Undercoat Layer

The undercoat layer 18 may be applied directly to the blocking layer 14, and be generally contiguous therewith. The undercoat layer 18 may function as an adhesive interface layer to secure the blocking layer 14 to the charge generation layer 22. Alternatively or additionally, a separate adhesive interface layer 16 may be provided intermediate the undercoat layer 18 and the blocking layer 14 and/or intermediate the undercoat layer 18 and the charge generation layer 22. In the embodiment illustrated in FIG. 1, an interface layer 16 is situated intermediate the blocking layer and undercoat layer 18. The interface layer may include a copolyester resin. Exemplary polyester resins which may be utilized for the interface layer include polyarylatepolyvinylbutyrals, such as ARDEL POLYARYLATE (U-100) commercially available from Toyota Hsutsu Inc., VITEL PE-100™, VITEL PE-200™, VITEL PE-200D™, and VITEL PEITEL PE-222™, all from Bostik, 49,000 polyester from Rohm Hass, polyvinyl butyral, and the like. The adhesive interface layer 16 may be applied directly to the hole blocking layer 14. Thus, the adhesive interface layer 16 in embodiments is in direct contiguous contact with both the underlying hole blocking layer 14 and the overlying undercoat layer 18 to enhance adhesion bonding to provide linkage. In other embodiments, the adhesive interface layer 16 is placed between the undercoat layer 18 and the charge generating layer 22 and can be in direct, contiguous contact with both. In yet other embodiments, the adhesive interface layer 16 is entirely omitted, as shown in FIG. 2.

Any suitable solvent or solvent mixtures may be employed to form a coating solution of the polyester for the adhesive interface layer 16. Typical solvents include tetrahydrofuran, toluene, monochlorbenzene, methylene chloride, cyclohexanone, and the like, and mixtures thereof. Any other suitable and conventional technique may be used to mix and thereafter apply the adhesive layer coating mixture to the hole blocking layer. Typical application techniques include spraying, dip coating, roll coating, wire wound rod coating, and the like. Drying of the deposited wet coating may be effected by any suitable conventional process, such as oven drying, infra red radiation drying, air drying, and the like.

The adhesive interface layer 16 may have a thickness of from about 0.01 micrometers to about 900 micrometers after drying. In embodiments, the dried thickness is from about 0.03 micrometers to about 1 micrometer.

Figure 2:
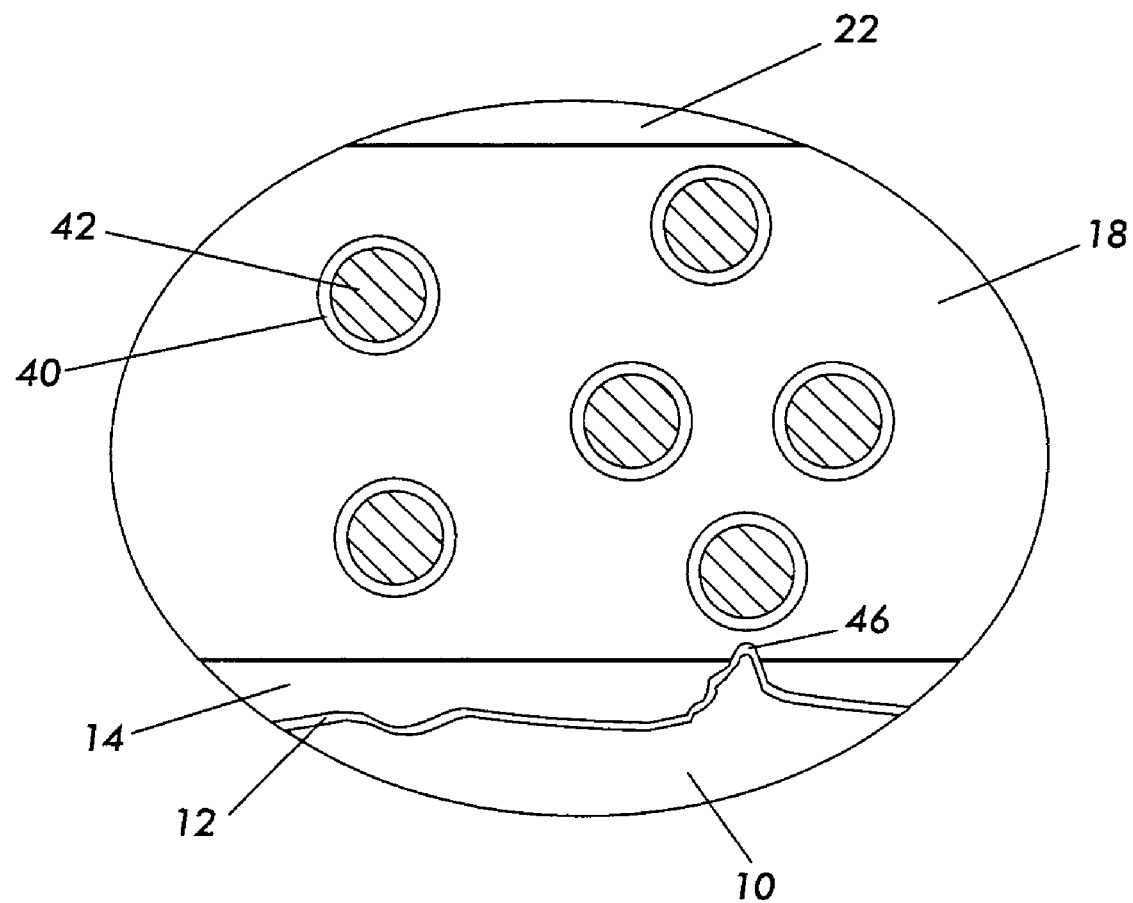
FIG. 2 shows an enlarged cross sectional view of an exemplary imaging member according to a third embodiment.

The undercoat layer 18 may include a film forming polymer in which a charge blocking material 40 is finely dispersed in the layer matrix, as illustrated in FIG. 2 (not to scale). In particular, the charge blocking material, as a thin encapsulation of, for example, no more than a few molecules in thickness, is supported on the surface of a finely divided particulate material, which is dispersed throughout the undercoat layer. The particulate material comprises particles 42 which may have an average diameter or size (D(50)) of up to about 500 nanometers, and thus may be referred to herein as nanoparticles. It should be noted that (D(50)) means that 50% of the particles are less than the stated diameter and 50% of the particles have a greater diameter. In various aspects, the nanoparticles have an average size of less than about 200 nanometers, e.g., less than about 100 nanometers, and in specific embodiments, an average diameter of less than about 60 nanometers. For practical purposes, the particles 42 have an average size of at least about 2 nanometers and in specific embodiments, at least about 20 nanometers, e.g., 20-60 nanometers. In aspects of the exemplary embodiment, at least 90% of the particles in the undercoat layer have a diameter of less than 200 nanometers. In various aspects, the nanoparticles may have a particle size distribution of not larger than 90 nanometers. In one aspect, at least about 90% of the particles in the undercoat layer are in the range of between about 2 nanometers and about 90 nanometers.

In general, the smaller nanoparticle sizes result in a high surface area on which the charge blocking material 40 may be carried as a coating. The charge blocking material may encapsulate the particles or may only partially cover the particles. The particles may be spherical or irregular in shape or of any other suitable shape. The particles can be dispersed generally uniformly in the polymer to provide a generally homogeneous distribution throughout the matrix of undercoat layer 18 as shown in FIG. 2, or may have a higher concentration in one part of the undercoat layer 18, for example, in a region adjacent the surface of the undercoat layer which is closest to the blocking layer 14.

The particulate material 42 may be an inorganic or organic material. Exemplary inorganic materials include oxides, such as metal oxides and silicates, and salts. Examplary oxides include synthetic amorphous silica such as fumed silica, precipitated silica, pyrogenic silica, and silica gels, such as aerogels and hydrogels, as well as crystalline silica. Metal oxides and salts may be in either a pure or a mineral form. Included among these are aluminum oxide ($Al_2O_3$), antimony oxide, arsenic oxide, iron oxide (Hematite, Magnetite), lead oxide (Litharge, Minium), magnesium oxide (Periclas), manganese oxide (Hausmannite, Manganosite, Pyrolusite), nickel oxide (Bunsenite), tin oxide (Cassiterite), titanium oxide (Brookite, rutile, anatase), zinc oxide (Zincite), and zirconium oxide (Baddeleyite). Exemplary salts and silicates include barium sulfate (Barite), lead sulfate (Anglesite), potassium sulfate (Arcanite), sodium sulfate (Themadite), antimony sulfite (Stibnite), arsenic sulfide (Orpiment, Realgar), cadmium sulfide (Greenockite), calcium sulfide (Oldhamite), iron sulfide (Mrcasite, Pyrite, Pyrrhotite), lead sulfide (Galena), zinc sulfide (Sphalerite, Wurtzite), barium carbonate (Witherite), iron carbonate (Siderite), lead carbonate (Cerussite), magnesium carbonate (Magnesite), manganese carbonate (Rhodochrosite), sodium carbonate (Thermonatrite), zinc carbonate (Smithsonite), calcium carbonate, aluminum hydroxide (Boehmite, Diaspore, Gibbsite), iron hydroxide (Goethite, Lepidocrocite), manganese hydroxide (Pydrochroite), copper chloride (Nantokite), lead chloride (Cotunnite), silver chloride (Cerargyrite), silver iodide (Jodyrite, Miersite), lead chromate (Crocoite), beryllium silicate (Phenakite), sodium aluminosilicate (Natrolite, Mesolite, Scolecite, Thomasonite), calcium silicate, zirconium silicate (Zircon), as well as acmite (Aegirine), brimstone (Sulfur), carborundum (Moissanite), chromspinel (Chromite), epsomsalt (Epsomite), garnet (Almandine, Pyrope, Spessartite), indocrase (Vesuvianite), iron spinel (Hercynite), lithiophyllite (Triphylite), orthite (Allanite), peridote (Olivine), pistacite (Epidote), titanite (Sphene), kaolinite, zinc sulfate, and the like.

In particular, a neutral or hydrophobic amorphous silica may be used having a diameter of from about 2 nanometers to about 90 nanometers. The surface of the silica particles 42 can be smooth to prevent generation of air bubbles during the dispersion preparation process. A commercially available hydrophobic silica, such as Aerosil from Degussa and Nippon Aerosil Co., or a fumed silica from Cabot may suitably be used.

The charge blocking material 40 is generally one which serves to block or at least reduce positive charge injection from the substrate and/or block or reduce migration of positive charge from the spiked projections of the ground plane layer 12. As illustrated schematically in FIG. 2, if a peak 46 of the electrically conductive layer 12 extends through the blocking layer 14 into the undercoat layer 18, the blocking material 40 on a closely adjacent coated particle 42 inhibits or stops the injection of holes into the layer 18 via the peak 46. The charge blocking material 40 can be present in a sufficient amount to reduce the average number of charge deficient spots in photoreceptors incorporating the undercoat layer as compared with photoreceptors similarly prepared but without the undercoat layer.

For example, the charge blocking material 40 is applied as thin encapsulation layer over the surfaces of the particles 42. The blocking material layer 40 may be from about one to ten molecules in thickness. For example, it may be present as a mono-molecular or tri-molecular layer coating which partially or fully cover each particle surface. In various aspects, the blocking material coated particles may be present in the matrix of the undercoat layer 18 at a dispersion concentration of between about 10 and about 90 weight percent, based on the total weight of the dried undercoat layer. In one embodiment, the dispersion of blocking material encapsulated particles is present in the undercoat layer at a concentration of at least about 20 weight percent and in another embodiment, at least about 40 weight percent.

Exemplary charge blocking materials 40 include N-functional silanes (silanes containing a nitrogen-containing functional group), such as gamma amino-functional silanes, e.g., (gamma-aminopropyl) trialkoxy silanes. Other exemplary charge blocking materials include N-containing titanates and zirconates. Combinations of such charge blocking materials 40 may be employed. In other aspects, the blocking material 40 may additionally or alternatively comprise a film forming polymer which has inherent hole blocking capacity, such as, for example, hydroxyethylmethacrylate (HEMA) and polyphosphazines.

Illustrative examples of specific materials which may be used as the charge blocking material include (gamma-aminopropyl) triethoxy silane, (gamma aminopropyl) trimethoxy silane, trimethoxysilyl propylene diamine, hydrolyzed trimethoxy silyl propyl ethylene diamine, $[H_2N(CH_2)_4]CH_3Si(OC_2H_5)_2$, (gamma-aminobutyl) methyl diethoxysilane, $[H_2N(CH_2)_3]CH_3 Si(OCH_3)_2$ (gamma-aminopropyl) methyl dimethoxysilane, and combinations thereof. In one embodiment, the charge blocking material 40 used in the undercoat layer is the same as that used in the blocking layer 14.

The supported charge blocking material may be formed by combining the particulate material with the charge blocking material, optionally with a suitable solvent, to coat the particles with the charge blocking material.

Exemplary polymer resins for forming the undercoat layer include polyester-based polyurethanes and polyether-based polyurethanes, such as thermoset and thermo-plastic polyurethanes. Thermoplastic film forming polyurethanes have advantages in that, unlike thermoset polyurethanes, they are easily made into coating solution without the need for a crosslinking agent and a catalyst. Inclusion of crosslinking agents and catalysts in the undercoat layer may cause deleterious photoelectrical degradation of the fabricated imaging member in some instances. Further, thermoplastic polyurethanes are particularly suited as they are insoluble to the solvent used in the charge transport layer and thus tend to block the migration of charge transport molecules through the charge generation layer and toward the conductive ground plane layer during the application of the charge transport layer solution. Any suitable linear thermoplastic film forming polyurethane resin may be utilized. A typical film forming thermoplastic polyurethane contains predominantly urethane structural linkages between repeating units in the polymer chain.

Exemplary thermoplastic film forming polyurethane resins for the undercoat layer are straight chain linear polymers comprising a reaction product of a low molecular weight diol serving as a chain extender, an aromatic diphenyl methane diisocyanate or an aliphatic dicyclohexyl methane diisocyanate, and a linear difunctional polyether or polyester polyol. The low molecular weight chain extender is generally a difunctional aliphatic oligomer of glycols which is reactive with the isocyanate group of the diphenyl methane diisocyanate. Typical difunctional aliphatic oligomers of glycols include, for example, ethylene glycol, propylene glycol, 1,4 butanediol, 1,6 hexanediol and the like. In the event that a low molecular weight difunctional amine is used as a substitute for the glycol chain extender, the difunctional amine may include, for example, ethylenediamine, toluenediamines, alkyl substituted (hindered) toluenediamines, and the like. Typical diisocyanates useful for the synthesis of thermoplastic polyurethanes include diphenyl methane diisocyanates such as 4,4'-diphenyl methane diisocyanate, 2,4'-diphenyl methane diisocyanate, and the like. Aliphatic diisocyanates that are also suitable for synthesis of thermoplastic polyurethanes include 4,4'-dicyclohexyl methane diisocyanate, 2,4'-dicyclohexyl methane diisocyanate, and the like. Suitable difunctional polyether polyols are typically prepared by the oxyalkylation of a dihydric alcohol such as ethylene glycol, propylene glycol, butylene glycol, neopenty glycol, 1,6-hexanediol, hydroquinone, resorcinol, bisphenols, aniline and other aromatic monoamines, aliphatic monoamines and monoesters of glycerine with ethylene oxide, propylene oxide, butylene oxide, and the like. The expression "difunctional" as employed herein is defined as a linear molecule having two-end terminal functional groups that are readily reactive with the diisocyanate during the thermoplastic polyurethane synthesizing process.

The difunctional polyester polyol for polyurethane synthesis may be obtained by simply polymerizing a polycarboxylic diacid or its derivative (e.g. acid chloride or anhydride) with a polyol. Typical polycarboxylic acids suitable for this purpose include malonic acid, citric acid, succinic acid, glutaric acid, adipic acid, pimelic acid, azelaic acid, sebasic acid, maleic acid, fumaric acid, terephthalic acid, phthalic acid and the like. Typical polyols suitable for the preparation of polyester polyols include, for example, trimethylopropane, trimethylolethane, 2-methylglucoside, sorbitol, low molecular weight polyols such as polyoxyethlene glycol, polyoxy propylene glycol and block heteric polyoxyethylene-polyoxpropylene glycols, and the like.

Typical commercially available linear thermoplastic film forming polyurethane resins substantially free of any cross linking and suitable for the undercoat layer 18 include, for example, Kramilon U-1180, a polyester polyurethane elastomer having aliphatic polyester as a soft segment (available from Kuraray Co., Ltd), Elatollan™ (available from BASF Corporation), Texin™ and Desmopan™ (available from Bayer Corporation), Pellethan™ and Isoplast™ (available from Dow Chemical Company), and Estane™ (available from B F Goodrich Specialty Chemicals). These thermoplastic film forming polyurethane resins can be used either alone or in a blend of two or more. The linear thermoplastic film forming polyurethane resins may have a weight average molecular weight of from about 70,000 to about 170,000 for satisfactory results.

The thermoplastic film forming polyurethane resin for the undercoat layer is one which is a film forming polymer and readily soluble in a selected organic solvent or a solvent mixture to form a coating solution, but which is totally insoluble in the solvent used in charge transport layer coating solution. Typical solvents for the preparation of coating solutions of linear thermoplastic film forming polyurethane resins include, for example, tetrahydrofuran, methyl ethyl ketone, dimethyl formamide, N-methylpyrrolidone, dimethyl acetamide, ethyl acetate, pyridine, m-cresol, benzyl alcohol, cyclohexanone, and the like and mixtures thereof. The coating solution formed with the linear thermoplastic film forming polyurethane resin is generally free of any cross linkable polyurethane resins because these tend to form gel particles in the resulting undercoat layer. Furthermore, the thermoplastic film forming polyurethane resin selected generally is insoluble (e.g., only sparingly soluble) in the solvent used for the subsequently applied charge transport layer and/or charge generation layer coating solutions. This helps to reduce the migration/diffusion of charge transport molecules from the charge transport layer toward the ground plane layer. Typical solvents in which the linear thermoplastic film forming polyurethane resin is insoluble, but in which typical polymers used for charge transport layer applications are soluble, include, for example, methylene chloride, chloroethane, ethylene chloride, perchloroethylene, trichloroethylene, tetrachloroethylene, chlorobenzene, carbon tetrachloride, and the like and mixtures thereof. For example, where the solvent used for the charge transport layer and/or charge generation layer is methylene chloride, the selected thermoplastic film forming polyurethane resin is generally insoluble in methylene chloride.

Any suitable and conventional techniques may be utilized to mix the thermoplastic polyurethane resin with a selected solvent or solvent mixture and coated particles to form an undercoat layer coating solution and to thereafter apply the solution as a coating. In general, the polyurethane resin is first dissolved in the solvent and the coated particles added to the solution. Typical coating application techniques include, for example, spraying, dip coating, roll coating, wire wound rod coating, and the like. Drying of the deposited coating may be effected by any suitable conventional technique such as oven drying, infra red radiation drying, air drying and the like.

Generally, the thickness of the thermoplastic polyurethane undercoat layer 18 after drying is generally less than about 20 micrometers and can be between about 0.1 micrometers and about 10 micrometers, but thicknesses outside this range can also be used. A dried thickness of between about 0.3 micrometers and about 5 micrometers is generally suitable.

The Charge Generating Layer

The photogenerating (charge generating) layer 22 may thereafter be applied to the undercoat layer 18. Any suitable charge generating binder layer 22 including a photogenerating/photoconductive material, which may be in the form of particles and dispersed in a film forming binder, such as an inactive resin, may be utilized. Examples of photogenerating materials include, for example, inorganic photoconductive materials such as amorphous selenium, trigonal selenium, and selenium alloys selected from the group consisting of selenium-tellurium, selenium-tellurium-arsenic, selenium arsenide and mixtures thereof, and organic photoconductive materials including various phthalocyanine pigments such as the X-form of metal free phthalocyanine, metal phthalocyanines such as vanadyl phthalocyanine and copper phthalocyanine, hydroxy gallium phthalocyanines, chlorogallium phthalocyanines, titanyl phthalocyanines, quinacridones, dibromo anthanthrone pigments, benzimidazole perylene, substituted 2,4-diamino-triazines, polynuclear aromatic quinones, and the like dispersed in a film forming polymeric binder. Selenium, selenium alloy, benzimidazole perylene, and the like and mixtures thereof may be formed as a continuous, homogeneous photogenerating layer. Benzimidazole perylene compositions are well known and described, for example, in U.S. Pat. No. 4,587,189, the entire disclosure thereof being incorporated herein by reference. Multi-photogenerating layer compositions may be utilized where a photoconductive layer enhances or reduces the properties of the photogenerating layer. Other suitable photogenerating materials known in the art may also be utilized, if desired. The photogenerating materials selected should be sensitive to activating radiation having a wavelength between about 600 and about 700 nm during the imagewise radiation exposure step in an electrophotographic imaging process to form an electrostatic latent image. For example, hydroxygallium phthalocyanine absorbs light of a wavelength of from about 370 to about 950 nanometers, as disclosed, for example, in U.S. Pat. No. 5,756,245.

Any suitable inactive resin materials may be employed in the photogenerating layer 22, including those described, for example, in U.S. Pat. No. 3,121,006, the entire disclosure thereof being incorporated herein by reference. Typical organic resinous binders include thermoplastic and thermosetting resins such as one or more of polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl butyral, polyvinyl acetate, polysiloxanes, polyacrylates, polyvinyl acetals, polyamides, polyimides, amino resins, phenylene oxide resins, terephthalic acid resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amideimide), styrene-butadiene copolymers, vinylidenechloride/vinylchloride copolymers, vinylacetate/vinylidene chloride copolymers, styrene-alkyd resins, and the like.

An exemplary film forming polymer binder is PCZ-400 (poly(4,4'-dihydroxy-diphenyl-1-1-cyclohexane) which has a $M_w$=40,000 and is available from Mitsubishi Gas Chemical Company, Ltd.

The photogenerating material can be present in the resinous binder composition in various amounts. Generally, from about 5 percent by volume to about 90 percent by volume of the photogenerating material is dispersed in about 10 percent by volume to about 95 percent by volume of the resinous binder, and more specifically from about 20 percent by volume to about 30 percent by volume of the photogenerating material is dispersed in about 70 percent by volume to about 80 percent by volume of the resinous binder composition.

The photogenerating layer 22 containing the photogenerating material and the resinous binder material generally ranges in thickness of from about 0.1 micrometer to about 5 micrometers, for example, from about 0.3 micrometers to about 3 micrometers when dry. The photogenerating layer thickness is generally related to binder content. Higher binder content compositions generally employ thicker layers for photogeneration.

The Charge Transport Layer

The charge transport layer 24 is thereafter applied over the charge generating layer 22 and may include any suitable transparent organic polymer or non-polymeric material capable of supporting the injection of photogenerated holes or electrons from the charge generating layer 22 and capable of allowing the transport of these holes/electrons through the charge transport layer to selectively discharge the surface charge on the imaging member surface. In one embodiment, the charge transport layer 24 not only serves to transport holes, but also protects the charge generating layer 22 from abrasion or chemical attack and may therefore extend the service life of the imaging member. The charge transport layer 24 can be a substantially non-photoconductive material, but one which supports the injection of photogenerated holes from the charge generation layer 22. In one embodiment, the charge transport layer is free or substantially free of photogenerating materials (e.g., layer 24 contains less than 1% of the concentration of photogenerating materials in the charge generating layer 22 and in one embodiment, less than 0.1% thereof. The layer 24 is normally transparent in a wavelength region in which the electrophotographic imaging member is to be used when exposure is effected therethrough to ensure that most of the incident radiation is utilized by the underlying charge generating layer 22. The charge transport layer should exhibit excellent optical transparency with negligible light absorption and neither charge generation nor discharge if any, when exposed to a wavelength of light useful in xerography, e.g., 400 to 900 nanometers. In the case when the photoreceptor is prepared with the use of a transparent substrate 10 and also a transparent conductive layer 12, imagewise exposure or erase may be accomplished through the substrate 10 with all light passing through the back side of the substrate. In this case, the materials of the layer 24 need not transmit light in the wavelength region of use if the charge generating layer 22 is sandwiched between the substrate and the charge transport layer 24. The charge transport layer 24 in conjunction with the charge generating layer 22 is an insulator to the extent that an electrostatic charge placed on the charge transport layer is not conducted in the absence of illumination. The charge transport layer 24 should trap minimal charges as the case may be passing through it.

The charge transport layer 24 may include any suitable charge transport component or activating compound useful as an additive molecularly dispersed in an electrically inactive polymeric material to form a solid solution and thereby making this material electrically active. The charge transport component may be added to a film forming polymeric material which is otherwise incapable of supporting the injection of photogenerated holes from the generation material and incapable of allowing the transport of these holes therethrough. This converts the electrically inactive polymeric material to a material capable of supporting the injection of photogenerated holes from the charge generation layer 22 and capable of allowing the transport of these holes through the charge transport layer 24 in order to discharge the surface charge on the charge transport layer. The charge transport component typically comprises small molecules of an organic compound which cooperate to transport charge between molecules and ultimately to the surface of the charge transport layer.

Any suitable inactive resin binder soluble in methylene chloride, chlorobenzene, or other suitable solvent may be employed in the charge transport layer. Exemplary binders include polyesters, polyvinyl butyrals, polycarbonates, polystyrene, polyvinyl formals, and combinations thereof. The polymer binder used for the charge transport layers may be, for example, selected from the group consisting of polycarbonates, poly(vinyl carbazole), polystyrene, polyester, polyarylate, polyacrylate, polyether, polysulfone, combinations thereof, and the like. Exemplary polycarbonates include poly (4,4'-isopropylidene diphenyl carbonate), poly(4,4'-diphenyl-1,1'-cyclohexane carbonate), and combinations thereof. The molecular weight of the binder can be for example, from about 20,000 to about 1,500,000. One exemplary binder of this type is a Makrolon™ binder, which is available from Bayer AG and comprises poly(4,4'-isopropylidene diphenyl) carbonate having a weight average molecular weight of about 120,000.

Exemplary charge transport components include aromatic polyamines, such as aryl diamines and aryl triamines. Exemplary aromatic diamines include N,N'-diphenyl-N,N'-bis (alkylphenyl)-1,1'-biphenyl-4,4-diamines, such as mTBD, which has the formula (N,N'-diphenyl-N,N'-bis[3-methylphenyl]-[1,1'-biphenyl]-4,4'-diamine); N,N'-diphenyl-N, N'-bis(chlorophenyl)-1,1'-biphenyl-4,4'-diamine; and N,N'-bis-(4-methylphenyl)-N,N'-bis(4-ethylphenyl)-1,1'-3,3'-dimethylbiphenyl)-4,4'-diamine (Ae-16), N,N'-bis-(3,4-dimethylphenyl)-4,4'-biphenyl amine (Ae-18), and combinations thereof.

Other suitable charge transport components include pyrazolines, such as 1-[epidyl-(2)]-3-(p-diethylaminophenyl)-5-(p-diethylaminophenyl)pyrazoline, as described, for example, in U.S. Pat. Nos. 4,315,982, 4,278,746, 3,837,851, and 6,214,514, substituted fluorene charge transport molecules, such as 9-(4'-dimethylaminobenzylidene)fluorene, as described in U.S. Pat. Nos. 4,245,021 and 6,214,514, oxadiazole transport molecules, such as 2,5-bis(4-diethylaminophenyl)-1,3,4-oxadiazole, pyrazoline, imidazole, triazole, as described, for example in U.S. Pat. No. 3,895,944, hydrazones, such as p-diethylaminobenzaldehyde (diphenylhydrazone), as described, for example in U.S. Pat. Nos. 4,150,987 4,256,821, 4,297,426, 4,338,388, 4,385,106, 4,387,147, 4,399,207, 4,399,208, 6,124,514, and tri-substituted methanes, such as alkyl-bis(N,N-dialkylaminoaryl)methanes, as described, for example, in U.S. Pat. No. 3,820,989. The disclosures of all of these patents are incorporated herein be reference in their entireties.

The concentration of the charge transport component in layer 24 may be, for example, at least about 5 weight % and may comprise up to about 60 weight %. The concentration or composition of the charge transport component may vary through layer 24, as disclosed, for example, in U.S. application Ser. No. 10/736,864, filed Dec. 16, 2003, entitled "Imaging Members," by Anthony M. Horgan, et al., which was published on Jul. 1, 2004, as Application Serial No. 2004/0126684; U.S. application Ser. No. 10/320,808, filed Dec. 16, 2002, entitled "Imaging Members," by Anthony M. Horgan, et al., which was published on Jun. 17, 2004, as Application Serial No. 2004/0115545, and U.S. application Ser. No. 10/655,882, filed Sep. 5, 2003, entitled "Dual charge transport layer and photoconductive imaging member including the same," by Damodar M. Pai, et al., which was published on Mar. 10, 2005 as Application Serial No. 2005/0053854, the disclosures of which are incorporated herein by reference in their entireties.

In one exemplary embodiment, layer 24 comprises an average of about 10-60 weight % N,N'-diphenyl-N,N'-bis(3-methylphenyl)-1,1'-biphenyl-4,4'-diamine, such as from about 30-50 weight % N,N'-diphenyl-N,N'-bis(3-methylphenyl)-1,1'-biphenyl-4,4'-diamine.

The charge transport layer 24 is an insulator to the extent that the electrostatic charge placed on the charge transport layer is not conducted in the absence of illumination at a rate sufficient to prevent formation and retention of an electrostatic latent image thereon. In general, the ratio of the thickness of the charge transport layer 24 to the charge generator layer 22 is maintained from about 2:1 to about 200:1 and in some instances as great as about 400:1.

Additional aspects relate to the inclusion in the charge transport layer 24 of variable amounts of an antioxidant, such as a hindered phenol. Exemplary hindered phenols include octadecyl-3,5-di-tert-butyl-4-hydroxyhydrociannamate, available as Irganox I-1010 from Ciba Specialty Chemicals. The hindered phenol may be present at about 10 weight percent based on the concentration of the charge transport component. Other suitable antioxidants are described, for example, in above-mentioned U.S. application Ser. No. 10/655,882 incorporated by reference.

In one specific embodiment, the charge transport layer 24 is a solid solution including a charge transport component, such as N,N'-diphenyl-N,N'-bis(3-methylphenyl)-1,1'-biphenyl-4,4'-diamine, molecularly dissolved in a polycarbonate binder, the binder being either a poly(4,4'-isopropylidene diphenyl carbonate) or a poly(4,4'-diphenyl-1,1'-cyclohexane carbonate). The charge transport layer may have a Young's Modulus in the range of from about $2.5 \times 10^5$ psi ($1.7 \times 10^4$ Kg/cm$^2$) to about $4.5 \times 10^5$ psi ($3.2 \times 10^4$ Kg/cm$^2$) and a thermal contraction coefficient of between about $6 \times 10^{-5}$/° C. and about $8 \times 10^{-5}$/° C.

The thickness of the charge transport layer 24 can be from about 5 micrometers to about 200 micrometers, e.g., from between about 15 micrometers and about 40 micrometers. The charge transport layer may comprise dual layers or multiple layers.

Other layers such as conventional ground strip layer 28 including, for example, conductive particles dispersed in a film forming binder may be applied to one edge of the imaging member to promote electrical continuity with the conductive layer 12 through the hole blocking layer 14, and undercoat layer 18. Ground strip layer 28 may include any suitable film forming polymer binder and electrically conductive particles. Typical ground strip materials include those enumerated in U.S. Pat. No. 4,664,995, the entire disclosure of which is incorporated by reference herein. The ground strip layer 28 may have a thickness from about 7 micrometers to about 42 micrometers, for example, from about 14 micrometers to about 23 micrometers. Optionally, an overcoat layer 26, if desired, may also be utilized to provide imaging member surface protection as well as improve resistance to abrasion.

The Overcoat Layer

Additional aspects relate to inclusion in the charge transport layer or to an overcoat layer 26 of nano particles as a dispersion, such as silica, metal oxides, Acumist™ (waxy polyethylene particles), PTFE, and the like. The nanoparticles may be used to enhance the lubricity and wear resistance of the charge transport layer 24. The particle dispersion concentrated in the top vicinity of the transport layer 24 can be up to about 10 weight percent of the weight or one tenth thickness of the charge transport layer 24 to provide optimum wear resistance without causing a deleterious impact on the electrical properties of the fabricated imaging member. Where an overcoat layer 26 is employed, it may comprise a similar resin used for the charge transport layer or a different resin and be from about 1 to about 2 microns in thickness.

Since the charge transport layer 24 can have a substantial thermal contraction mismatch compared to that of the substrate support 10, the prepared flexible electrophotographic imaging member may exhibit spontaneous upward curling due to the result of larger dimensional contraction in the charge transport layer 24 than the substrate support 10, as the imaging member cools down to room ambient temperature after the heating/drying processes of the applied wet charge transport layer coating. An anti-curl back coating 30 can be applied to the back side of the substrate support 10 (which is the side opposite the side bearing the electrically active coating layers) in order to render flatness.

The Anti-Curl Back Coating

The anti-curl back coating 30 may include any suitable organic or inorganic film forming polymers that are electrically insulating or slightly semi-conductive. The anti-curl back coating 30 used has a thermal contraction coefficient value substantially greater than that of the substrate support 10 used in the imaging member over a temperature range employed during imaging member fabrication layer coating and drying processes (typically between about 20° C. and about 130° C.). To yield the designed imaging member flatness outcome, the applied anti-curl back coating has a thermal contraction coefficient of at least about 1.5 times greater than that of the substrate support to be considered satisfactory; that is a value of at least approximately $1 \times 10^{-5}$/° C. greater than the substrate support, which typically has a substrate support thermal contraction coefficient of about $2 \times 10^{-5}$/° C. However, an anti-curl back coating with a thermal contraction coefficient at least about 2 times greater, equivalent to about $2 \times 10^{-5}$/° C. greater than that of the substrate support is appropriate to yield an effective anti-curling result. The applied anti-curl back coating 30 can be a film forming thermoplastic polymer, being optically transparent, with a Young's Modulus of at least about $2 \times 10^5$ psi ($1.4 \times 10^4$ Kg/cm$^2$), bonded to the substrate support to give at least about 15 gms/cm of 180° peel strength. The anti-curl back coating 30 may be from about 7 to about 20 weight percent based on the total weight of the imaging member, which may correspond to from about 7 to about 20 micrometers in dry coating thickness. The selected anti-curl back coating is readily applied by dissolving a suitable film forming polymer in any convenient organic solvent.

Exemplary film forming thermoplastic polymers suitable for use in the anti-curl back coating include polycarbonates, polystyrenes, polyesters, polyamides, polyurethanes, polyarylethers, polyarylsulfones, polyarylate, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, polyimides, amino resins, phenylene oxide resins, terephthalic acid resins, phenoxy resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amideimide), styrene-butadiene copolymers, vinylidenechloride-vinylchloride copolymers, vinylacetate-vinylidenechloride copolymers, styrene-alkyd resins, combinations thereof, and the like. These polymers may be block, random or alternating copolymers. Molecular weights can vary from about 20,000 to about 150,000. Suitable polycarbonates include bisphenol A polycarbonate materials, such as poly(4,4'-isopropylidene-diphenylene carbonate) having a molecular weight of from about 35,000 to about 40,000, available as Lexan 145™ from General Electric Company and poly(4,4'-isopropylidene-diphenylene carbonate) having a molecular weight of from about 40,000 to about 45,000, available as Lexan 141™ also from the General Electric Company. A bisphenol A polycarbonate resin having a molecular weight of from about 50,000 to about 120,000, is available as Makrolon™ from Farbenfabricken Bayer A. G. A lower molecular weight bisphenol A polycarbonate resin having a molecular weight of from about 20,000 to about 50,000 is available as Merlon™ from Mobay Chemical Company. Another suitable polycarbonate is poly(4,4-diphenyl-1,1'-cyclohexane carbonate), which is a film forming thermoplastic polymer comprising a structurally modified from bisphenol A polycarbonate which is commercially available from Mitsubishi Chemicals. All of these polycarbonates have a $T_g$ of between about 145° C. and about 165° C. and with a thermal contraction coefficient ranging from about $6.0 \times 10^{-5}$/° C. to about $7.0 \times 10^{-5}$/° C.

Furthermore, suitable film forming thermoplastic polymers for the anti-curl back coating 30, if desired, may include the same binder polymers used in the charge transport layer 24. The anti-curl back coating formulation may include a small quantity of a saturated copolyester adhesion promoter to enhance its adhesion bond strength to the substrate support. Typical copolyester adhesion promoters are Vitel™ polyesters from Goodyear Rubber and Tire Company, Mor-Ester™ polyesters from Morton Chemicals, Eastar PETG™ polyesters from Eastman Chemicals, and the like. To impart optimum wear resistance as well as maintaining the coating layer optical clarity, the anti-curl layer may further incorporate in its material matrix, about 5 to about 30 weight percent filler dispersion of silica particles, Teflon particles, $PVF_2$ particles, stearate particles, aluminum oxide particles, titanium dioxide particles or a particle blend dispersion of Teflon and any of these inorganic particles. Suitable particles used for dispersion in the anti-curl back coating include particles having a size of between about 0.05 and about 0.30 micrometers, and more specifically between about 0.18 and about 0.20 micrometers.

In one embodiment, the anti-curl back coating 30 is optically transparent. The term optically transparent is defined herein as the capability of the anti-curl back coating to transmit at least about 98 percent of an incident light energy through the coating. The anti-curl back coating of this embodiment includes a film forming thermoplastic polymer and may have a glass transition temperature (Tg) value of at least about 75° C., a thermal contraction coefficient value of at least about 1.5 times greater than the thermal contraction coefficient value of the substrate support, a Young's Modulus of at least about $2 \times 10^5$ p.s.i., and adheres well over the supporting substrate The multilayered, flexible electrophotographic imaging member web stocks having the undercoat layer fabricated in accordance with the embodiments described herein may be cut into rectangular sheets. Each cut sheet is then brought overlapped at ends thereof and joined by any suitable means, such as ultrasonic welding, gluing, taping, stapling, or pressure and heat fusing to form a continuous imaging member seamed belt, sleeve, or cylinder.

Figure 3:
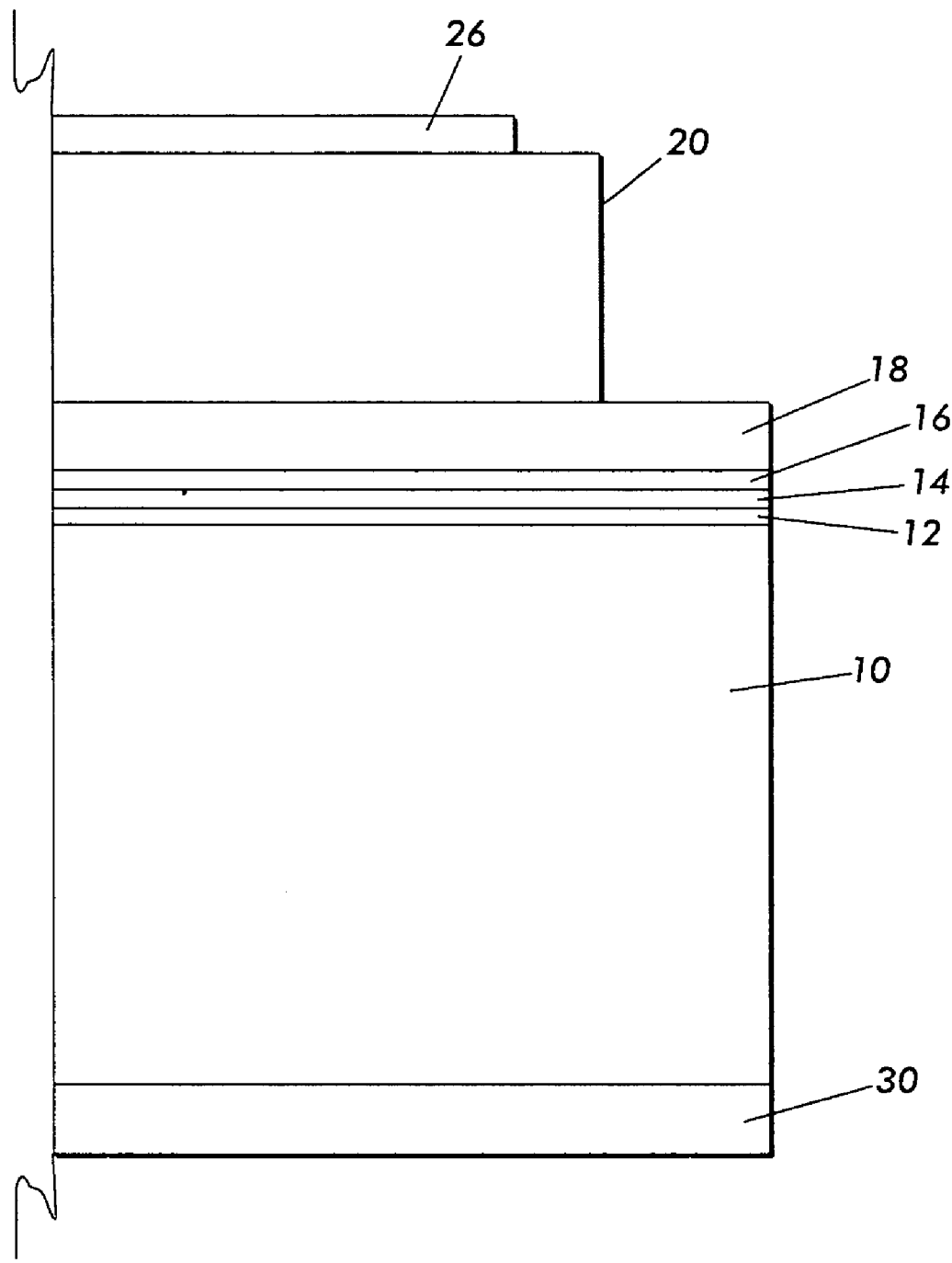
FIG. 3 is a schematic cross sectional view of an exemplary imaging member according to a second embodiment.

As an alternative to separate charge transport and charge generation layers, 22, 24, a single imaging layer 20 may be employed, as shown in FIG. 3, with other layers of the photoreceptor being formed as described above. Imaging layer 20 may comprise a single electrophotographically active layer capable of retaining an electrostatic charge in the dark during electrostatic charging, imagewise exposure and image development, as disclosed, for example, in U.S. application Ser. No. 10/202,296, filed Jul. 23, 2002, entitled "Imaging Members," by Liang-Bih Lin, et al., published Jan. 29, 2004, as Application No. 2004/0018440. The single imaging layer 20 may include charge transport molecules in a binder, similar to those of layer 24 and optionally may also include a photogenerating/photoconductive material, similar to those of the layer 22 described above.

The prepared flexible imaging belt may thereafter be employed in any suitable and conventional electrophotographic imaging process which utilizes uniform charging prior to imagewise exposure to activating electromagnetic radiation. When the imaging surface of an electrophotographic member is uniformly charged with an electrostatic charge and imagewise exposed to activating electromagnetic radiation, conventional positive or reversal development techniques may be employed to form a marking material image on the imaging surface of the electrophotographic imaging member. Thus, by applying a suitable electrical bias and selecting toner having the appropriate polarity of electrical charge, a toner image is formed in the charged areas or discharged areas on the imaging surface of the electrophotographic imaging member. For example, for positive development, charged toner particles are attracted to the oppositely charged electrostatic areas of the imaging surface and for reversal development, charged toner particles are attracted to the discharged areas of the imaging surface.

The effectiveness of the layer 18 can be evaluated by printing print media in a marking engine into which a photoreceptor belt formed according to the exemplary embodiment has been installed. Alternatively, the reduction in charge deficient spots can be evaluated using electrical techniques, such as those disclosed in U.S. Pat. Nos. 5,703,487; 5,697,024; 6,008,653; 6,119,536; 6,150,824 and 5,703,487, which are incorporated herein in their entireties by reference.

The development will further be illustrated in the following non-limiting examples, it being understood that these examples are intended to be illustrative only and that the disclosure is not intended to be limited to the materials, conditions, process parameters and the like recited herein. All proportions are by weight unless otherwise indicated.

EXAMPLES

Example 1

(Comparative)

An electrophotographic imaging member was prepared by providing a 0.02 micrometer thick titanium layer coated on a substrate of a biaxially oriented polyethylene naphthalate substrate (KADALEX, available from Dupont Teijin Films).

having a thickness of 3.5 mils (89 micrometers). The titanized KADALEX substrate was extrusion coated with a blocking layer solution containing a mixture of 6.5 grams of gamma aminopropyltriethoxy silane, 39.4 grams of distilled water, 2.08 grams of acetic acid, 752.2 grams of 200 proof denatured alcohol and 200 grams of heptane. This wet coating layer was then allowed to dry for 5 minutes at 135° C. in a forced air oven to remove the solvents from the coating and effect the formation of a crosslinked silane blocking layer. The resulting blocking layer had an average dry thickness of 0.04 micrometers, as measured with an ellipsometer.

An adhesive interface layer was then applied by extrusion coating to the blocking layer with a coating solution containing 0.16 percent by weight of ARDEL polyarylate, having a weight average molecular weight of about 54,000, available from Toyota Hsushu, Inc., based on the total weight of the solution in an 8:1:1 weight ratio of tetrahydrofuran/monochloro-benzene/methylene chloride solvent mixture. The adhesive interface layer was allowed to dry for 1 minute at 125° C. in a forced air oven. The resulting adhesive interface layer had a dry thickness of about 0.02 micrometer.

The adhesive interface layer was thereafter coated over with a charge generating layer. The charge generating layer dispersion was prepared by adding 0.45 gram of IUPILON 200, a polycarbonate of poly(4,4'-diphenyl)-1,1'-cyclohexane carbonate (PC-z 200) available from Mitsubishi Gas Chemical Corporation, and 50 milliliters of tetrahydrofuran to a 100 milliliter glass bottle. 2.4 grams of hydroxygallium phthalocyanine Type V and 300 grams of ⅛ inch (3.2 millimeters) diameter stainless steel shot were added to the solution. This mixture was then placed on a ball mill for about 20 to about 24 hours. Subsequently, 2.25 grams of poly(4,4'-diphenyl-1,1'-cyclohexane carbonate) having a weight average molecular weight of 20,000 (PC-z 200) were dissolved in 46.1 grams of tetrahydrofuran, then added to the hydroxygallium phthalocyanine slurry. This slurry was then placed on a shaker for 10 minutes. The resulting slurry was thereafter coated onto the adhesive interface layer by an extrusion application process to form a layer having a wet thickness of 0.25 mils (6.4×10$^{-4}$ mm). However, a strip of about 10 millimeters wide along one edge of the substrate web stock bearing the blocking layer and the adhesive layer was deliberately left uncoated by the charge generating layer to facilitate adequate electrical contact by a ground strip layer to be applied later. The charge generating layer comprising poly(4,4'-diphenyl)-1,1'-cyclohexane carbonate, tetrahydrofuran, and hydroxygallium phthalocyanine was dried at 125° C. for 2 minutes in a forced air oven to form a dry charge generating layer having a thickness of 0.4 micrometers.

The coated web stock thus formed was simultaneously coated over with a charge transport layer and a ground strip layer by co-extrusion of the coating materials. The charge transport layer was prepared by introducing into an amber glass bottle in a weight ratio of 1:1 (or 50 weight percent of each) of MAKROLON 5705 (a Bisphenol A polycarbonate thermoplastic having a molecular weight of about 120,000 commercially available from Farbensabricken Bayer A.G.) and N,N'-diphenyl-N,N'-bis(3-methylphenyl)-1,1'-biphenyl-4,4'-diamine (a charge transport compound).

The resulting mixture was dissolved to give 15 percent by weight solid in methylene chloride. This solution was applied on the charge generating layer by extrusion to form a coating which upon drying in a forced air oven gave a charge transport layer 29 micrometers thick.

The strip, about 10 millimeters wide, of the adhesive layer left uncoated by the charge generator layer, was coated with a ground strip layer during the co-extrusion process. The ground strip layer coating mixture was prepared by combining 23.81 grams of polycarbonate resin (MAKROLON 5705, 7.87 percent by total weight solids, available from Bayer A.G.), and 332 grams of methylene chloride in a carboy container. The container was covered tightly and placed on a roll mill for about 24 hours until the polycarbonate was dissolved in the methylene chloride. The resulting solution was mixed for 15-30 minutes with about 93.89 grams of graphite dispersion (12.3 percent by weight solids) of 9.41 parts by weight of graphite, 2.87 parts by weight of ethyl cellulose and 87.7 parts by weight of solvent (Acheson Graphite dispersion RW22790, available from Acheson Colloids Company) with the aid of a high shear blade dispersed in a water cooled, jacketed container to prevent the dispersion from overheating and losing solvent. The resulting dispersion was then filtered and the viscosity was adjusted with the aid of methylene chloride. This ground strip layer coating mixture was then applied, by co-extrusion with the charge transport layer, to the electrophotographic imaging member web to form an electrically conductive ground strip layer having a dried thickness of about 19 micrometers.

The imaging member web stock containing all of the above layers was then passed through a forced air oven at 125° C. for 3 minutes to simultaneously dry both the charge transport layer and the ground strip.

An anti-curl coating was prepared by combining 88.2 grams of polycarbonate resin (MAKROLON 5705), 7.12 grams VITEL PE-200 copolyester (available from Goodyear Tire and Rubber Company) and 1,071 grams of methylene chloride in a carboy container to form a coating solution containing 8.9 percent solids. The container was covered tightly and placed on a roll mill for about 24 hours until the polycarbonate and polyester were dissolved in the methylene chloride to form the anti-curl back coating solution. The anti-curl back coating solution was then applied to the rear surface (side opposite the charge generating layer and charge transport layer) of the electrophotographic imaging member web by extrusion coating and dried to a maximum temperature of 125° C. in a forced air oven for 3 minutes to produce a dried coating layer having a thickness of 17 micrometers and flatten the imaging member.

Example 2

An electrophotographic imaging member was prepared according to the exemplary embodiment using the same materials and procedures as described for Example 1, with the exception that an undercoat layer was prepared and inserted between the charge generating layer and the adhesive interface layer to give a material configuration as that shown in FIG. 1, but without an overcoat.

The undercoat layer was prepared by dissolving a film forming polyether thermoplastic polyurethane, Ellastollan™1180A (commercially available from BASF Corporation) in tetrahydrofuran. Gamma aminopropyl trimethoxy silane (3-APS) encapsulated nano particles of fumed silica (CEP10AA9810, available from Cabot Corporation) were dispersed in this solution using a high shear mixer, to give an undercoat layer coating solution. After application of the coating solution over the adhesive interface layer and drying at 120° C., the resulting dried undercoat thermoplastic polyurethane undercoat layer was approximately 0.3 micrometers in thickness and comprised about 60 weight percent coated particle in dispersion, based on the total dried weight of the layer. The dried undercoat layer was totally insoluble in the methylene chloride used in the charge transport layer coating solution, to stop the charge transport molecules diffusion.

Example 3

Evaluation of Charge Deficient Spots

The electrophotographic imaging members of Examples 1 and 2 were first evaluated for overall photo-electrical properties. The measurements were conducted with a conventional drum scanner in which the imaging members were charged to typical voltages used in an imaging machine and discharged by a known amount of light. The testing results confirmed that the charge acceptance, photosensitivity, dark decay, back ground and residual voltages, and electrical cyclic stability were not substantially affected by the addition of the disclosed undercoat layer to the imaging member.

The imaging members Examples 1 and 2 were then further tested for their propensity to produce charge deficient spots (CDS) using a high field induce dark decay (HiFIDD) measurement technique according to the procedure described in U.S. Pat. No. 5,697,024, incorporated herein by reference. In brief, a sample of the imaging member of Example 1 was coated with conducting semi-transparent electrodes of gold, about 100 angstrom thick and 1 cm in diameter. Successively increasing voltage pulses were applied at these electrodes for 100 milliseconds and the differential increase in dark decay was measured at each field. The value at the highest field applied was measured (HiFIDD). In similar manner, a sample piece of the imaging member of Example 2 was coated with contact electrodes and the HiFIDD was measured. The measured value obtained for the imaging member sample of Example 2, having an undercoat layer comprising a 3-APS encapsulated nano silica particles dispersion, was 250 volts and that of the imaging member of Example 1 (comparative example) was 524 volts. The FIDD number (which represents predominantly the localized dark decay as the CDS spots) for the imaging member of Example 2 was very low compared to the comparative imaging member formed without an undercoat layer. The data demonstrate the effectiveness of the undercoat layer formed according to the exemplary embodiment, to suppress and minimize the development of CDS print defects in copy out-put.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. An imaging member comprising:
an electrically conductive layer;
a positive charge blocking layer;
an imaging layer; and
an undercoat layer intermediate the imaging layer and the electrically conductive layer, the undercoat layer comprising a film forming polymer and a particulate material dispersed therein, the particulate material supporting a charge blocking material thereon, wherein the charge blocking material comprises at least one of an N-functional silane, an N-functional titanate, and an N-functional zirconate.

2. The imaging member of claim 1, wherein the imaging layer comprises at least one of a charge generation layer and a charge transport layer.

3. The imaging member of claim 2, wherein the undercoat layer is intermediate the charge generation layer and the blocking layer.

4. The imaging member of claim 2, wherein the charge generation layer comprises a photogenerating material and wherein the charge transport layer is substantially free of photogenerating materials.

5. The imaging member of claim 2, wherein the film forming polymer is insoluble in a solvent used in forming the charge transport layer.

6. The imaging member of claim 1, wherein the film forming polymer comprises a thermoplastic polyurethane.

7. The imaging member of claim 1, wherein the undercoat layer has a thickness of from about 0.1 microns to about 10 micrometers.

8. The imaging member of claim 1, wherein the particulate material comprises an inorganic material selected from the group consisting of silica, oxides, metal oxides, metal carbonates, metal silicates, metal salts, metal sulfates, metal sulfites, and combinations thereof.

9. The imaging member of claim 1, wherein the particulate material has an average particle size of less than about 500 nm.

10. The imaging member of claim 1, wherein the particulate material has an average particle distribution of less than about 90 nm.

11. The imaging member of claim 9, wherein at least about 90% of the particulate material is in the range of about 2 nm to about 90 nm.

12. The imaging member of claim 1, wherein the charge blocking material comprises an N-functional silane.

13. The imaging member of claim 12, wherein the charge blocking material is selected from the group consisting of (gamma-aminopropyl) triethoxy silane, (gamma aminopropyl) trimethoxy silane, (gamma-aminobutyl) methyl diethoxysilane, (gamma-aminopropyl) methyl dimethoxysilane, trimethoxysilyl propylene diamine, hydrolyzed trimethoxy silyl propyl ethylene diamine, and combinations thereof.

14. The imaging member of claim 1, wherein the particulate material supporting the charge blocking material comprises from about 10 to about 90 wt% dispersion based on the total weight of the undercoat layer 15. The imaging member of claim 2, wherein the charge transport layer comprises a charge transport component comprising an aryl amine.

16. The imaging member of claim 12, wherein the charge transport component comprises (N,N'-diphenyk-N,N'-bis[3-methylphenyl]-[1,1'-biphenyl]-4,4'-diamine).

17. The imaging member of claim 1, wherein the charge blocking material of the undercoat layer is one which reduces charge deficient spots as compared with an imaging member comparably formed without the undercoat layer.

18. The imaging member of claim 1, wherein the imaging layer comprises a charge transport component and a photogenerating material.

19. The imaging member of claim 1, further comprising an adhesive interface layer intermediate the imaging layer and the positive charge blocking layer, the undercoat layer contacting the adhesive interface layer.

20. A xerographic printing system comprising the imaging member of claim 1.

21. An imaging member comprising:
an electrically conductive layer;
a positive charge blocking layer;

an imaging layer; and an undercoat layer intermediate the imaging layer and the electrically conductive layer, the undercoat layer comprising a film forming polymer and a particulate material dispersed therein, the particulate material supporting a charge blocking material thereon, wherein the positive charge blocking layer comprises a charge blocking material which is the same as the charge blocking material supported on the particulate material.

22. An imaging member comprising:

an optional substrate;

a charge blocking layer;

a charge generation layer comprising a first polymer;

a charge transport layer comprising a second polymer;

an optional adhesive interface layer intermediate the charge blocking layer and the charge generation layer;

an undercoat layer intermediate the charge blocking layer and the charge generation layer, the undercoat layer comprising a film forming polymer, and a particulate material supporting a charge blocking material thereon dispersed therein, wherein the charge blocking material comprises at least one of an N-functional silane, an N-functional titanate, and an N-functional zirconate;

wherein the film forming polymer of the undercoat layer is insoluble in a solvent which either the first polymer or the second polymer is soluble.

* * * * *